(12) United States Patent
Hollis et al.

(10) Patent No.: US 9,911,469 B1
(45) Date of Patent: Mar. 6, 2018

(54) APPARATUSES AND METHODS FOR POWER EFFICIENT DRIVER CIRCUITS

(71) Applicant: MICRON TECHNOLOGY, INC., Boise, ID (US)

(72) Inventors: Timothy M. Hollis, Meridian, ID (US); Dean D. Gans, Nampa, ID (US); Larren G. Weber, Caldwell, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/348,578

(22) Filed: Nov. 10, 2016

(51) Int. Cl.
*G11C 8/00* (2006.01)
*G11C 7/10* (2006.01)
*G11C 7/12* (2006.01)
*G11C 8/08* (2006.01)

(52) U.S. Cl.
CPC .............. *G11C 7/1063* (2013.01); *G11C 7/12* (2013.01); *G11C 8/08* (2013.01)

(58) Field of Classification Search
CPC ....... G11C 7/04; G11C 7/1051; G11C 7/1057; G11C 7/22; G11C 7/222
See application file for complete search history.

(56) References Cited

U.S. PATENT DOCUMENTS

| 5,973,534 A | 10/1999 | Singh |
| 6,028,449 A | 2/2000 | Schmitt |
| 6,043,681 A | 3/2000 | Lim |
| 2004/0027163 A1 | 2/2004 | Carpenter et al. |
| 2009/0267641 A1 | 10/2009 | Chen et al. |
| 2011/0249520 A1* | 10/2011 | Kim .......................... G11C 7/04 365/193 |
| 2015/0348491 A1* | 12/2015 | Kim .......................... G09G 5/00 345/212 |

OTHER PUBLICATIONS

International Search Report and Written Opinion dated Nov. 17, 2017 for Application No. PCT/US2017/045927.

* cited by examiner

*Primary Examiner* — Thong Q Le
(74) *Attorney, Agent, or Firm* — Dorsey & Whitney LLP

(57) ABSTRACT

An apparatus comprising is disclosed. The apparatus a driver circuit configured to selectively provide a first supply voltage to an output node in a first operating mode and to selectively provide a second supply voltage to the output node in a second operating mode, based on one or more enable signals.

18 Claims, 8 Drawing Sheets

APPARATUSES AND METHODS FOR POWER EFFICIENT DRIVER CIRCUITS

BACKGROUND

Integrated circuits typically include a number of input/output (I/O) pins which are used for communication with additional circuitry. For example, an integrated memory device such as a dynamic random access memory (DRAM) includes output nodes at I/O pins for bi-directional data communication with an external system or processor. Integrated circuits also typically include one or more driver circuits for driving signals on interface buses coupled to the I/O pins. Driver circuits selectively couple a supply voltage to an output node to drive an output signal on the interface bus coupled to the output node. As clock speeds increase, there is also a desire to provide the output signals more quickly to match the increase in clock speeds. Increasing the supply voltages is one way to increase transmission speeds, but this results in an undesirable increase in power consumption.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Embodiments disclosed herein are directed to driver circuits for improving power efficiency by selectively driving an output signal with different supply voltages using a single driver circuit. Selection may be based on the desired operating speed of a memory device. For example, the memory is operating a lower speed, the driver circuit may selectively couple a lower supply voltage to an output terminal to drive the output signal. When the memory is operating at a higher speed, the driver circuit may selectively couple a higher supply voltage to the output terminal to drive the output signal. By selectively coupling the output terminal to a lower or higher supply voltage based on the operating speed of the memory device, power efficiency may be improved by only operating at the higher supply voltage when needed.

Figure 1:
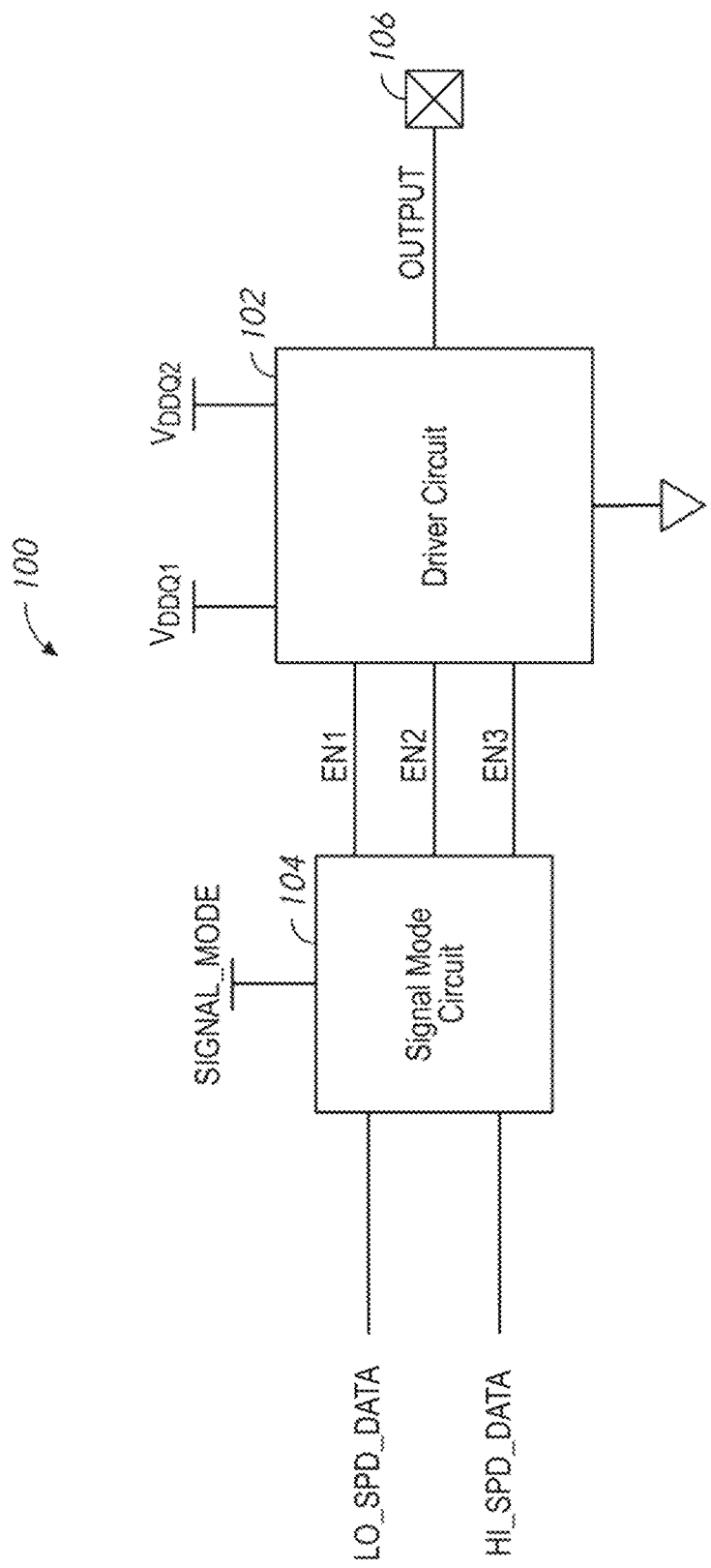
FIG. 1 is a block diagram of an apparatus including a driver circuit, in accordance with an embodiment of the present invention.

FIG. 1 is a block diagram of an apparatus, generally designated 100, including a driver circuit 102, in accordance with an embodiment of the present invention. In addition to the driver circuit 102, the apparatus 100 includes a signal mode circuit 104, and an output node 106. The apparatus 100 may be a part of single integrated circuit chip (or single semiconductor die) so that the output node 106 may serve as an I/O pin of the single integrated circuit chip (or single semiconductor die) to communicate an external system such as processor or controller.

The driver circuit 102 selectively couples different supply voltages to the output node 106. The driver circuit 102 may be coupled to the output node 106 and the signal mode circuit 104. The driver circuit 102 may be coupled to a first voltage source configured to provide a first supply voltage $V_{DDQ1}$ and coupled to a second voltage source configured to provide a second supply voltage $V_{DDQ2}$. The first supply voltage $V_{DDQ1}$ and the second supply voltage $V_{DDQ2}$ may provide different voltage levels. For example the first supply voltage $V_{DDQ1}$ may provide a lower voltage than the second supply voltage $V_{DDQ2}$. In one embodiment, the first supply voltage $V_{DDQ1}$ may provide a voltage of ≤0.6V, and the second supply voltage $V_{DDQ2}$ may provide a voltage of ≥0.9V. However, other voltage levels may also be used in various embodiments. The driver circuit 102 may also be coupled to ground or a third voltage supply that is less than the first and second voltage supplies that may serve as a reference voltage or a third supply voltage. The driver circuit 102 may include sets of parallel driver legs (not shown in FIG. 1) that are each configured to receive one of the enable signals EN1-3 and selectively couple the first supply voltage $V_{DDQ1}$, the second supply voltage $V_{DDQ2}$, or ground to the output node 106 to provide the OUTPUT signal based on the enable signals EN1-3.

The signal mode circuit 104 provides enable signals EN1-3 for controlling which of the first supply voltage $V_{DDQ1}$, the second supply voltage $V_{DDQ2}$, and ground the driver circuit 102 is coupled to the output node 106 to provide the OUTPUT signal. The signal mode circuit 104 may be configured to receive a first data signal LO_SPD_DATA, a second data signal HI_SPD_DATA, and a SIGNAL_MODE signal. Based on the value of the SIGNAL_MODE signal, the signal mode circuit 104 derives the enable signals EN1-3 from the first data signal LO_SPD_DATA and the second data signal HI_SPD_DATA and provides the enable signals EN1-3 to the driver circuit 102. In various embodiments, each enable signal EN1-3 may be configured to selectively enable/disable one of the first supply voltage $V_{DDQ1}$, the second supply voltage $V_{DDQ2}$, and ground by coupling it to the output node 106. For example, the enable signal EN1 may be configured to selectively couple the first supply voltage $V_{DDQ1}$ to the output node 106. The enable signal EN2 may be configured to selectively couple the second supply voltage $V_{DDQ2}$ to the output node 106. The enable signal EN3 may be configured to selectively couple the ground to the output node 106.

In various embodiments, the SIGNAL_MODE signal is based on resource usage within circuits, blocks, modules, etc. associated with the driver circuit 102. For example, the driver circuit 102 may be included in a memory device configured to drive an OUTPUT signal from the memory device (not shown). In such embodiments, the SIGNAL_MODE signal may be indicative of the operating speed and/or bandwidth requirements of the memory device. When the operating speed/bandwidth requirements are relatively low, the SIGNAL_MODE signal may have a first value. When the operating speed/bandwidth requirements are relatively high, the SIGNAL_MODE signal may have a second value. Based on whether the SIGNAL_MODE signal has the first or second value, the signal mode circuit 104 may provide the enable signals EN1-3 to drive the OUTPUT signals based on the first supply voltage $V_{DDQ1}$ or the second supply voltage $V_{DDQ2}$. For example, when the SIGNAL_MODE signal has the first value, indicating low operating speeds/bandwidth requirements, the signal mode circuit 104 may provide the enable signals EN1-3 having values such that the driver circuit 102 provides the OUTPUT signal by selectively coupling the first supply voltage $V_{DDQ1}$ (e.g., the lower supply voltage) to the output node 106. Alternatively, when the SIGNAL_MODE signal has the second value, indicating high operating speeds/bandwidth requirements, the signal mode circuit 104 provides the enable signals EN1-3 having values such that the driver circuit 102 provides the OUTPUT signal by selectively coupling the second supply voltage $V_{DDQ2}$ (e.g., the higher supply voltage) to the output node 106.

The first and second data signals LO_SPD_DATA, HI_SPD_DATA may contain identical data encoded using different line codes. A line code is a code chosen for transmitting a digital signal down a line. For example, the first data signal LO_SPD_DATA may be transmitted using a binary non-return-to-zero (NRZ) code, such as NRZ Level, NRZ Inverted, NRZ Mark, or NRZ Space. Because the NRZ code is binary, one bit is communicated per data window. The data window represents a sample period during which one or more data bits are transmitted, represented by a voltage level. The second data signal HI_SPD_DATA may be transmitted using a multilevel signal (MLS) such as pulse-amplitude modulation (PAM). In MLS encoding, multiple bits (e.g., 2 bits) are encoded together and represented by a single voltage level, allowing more information to be transmitted in a single data window. While MLS encoding increases the bandwidth of data transfer, it typically increases power consumption at the output driver circuit because higher voltages must be provided to create the multiple levels of the signal. In various embodiments, the first and second data signals LO_SPD_DATA, HI_SPD_DATA may be read data received from a memory array (not shown).

Figure 2:
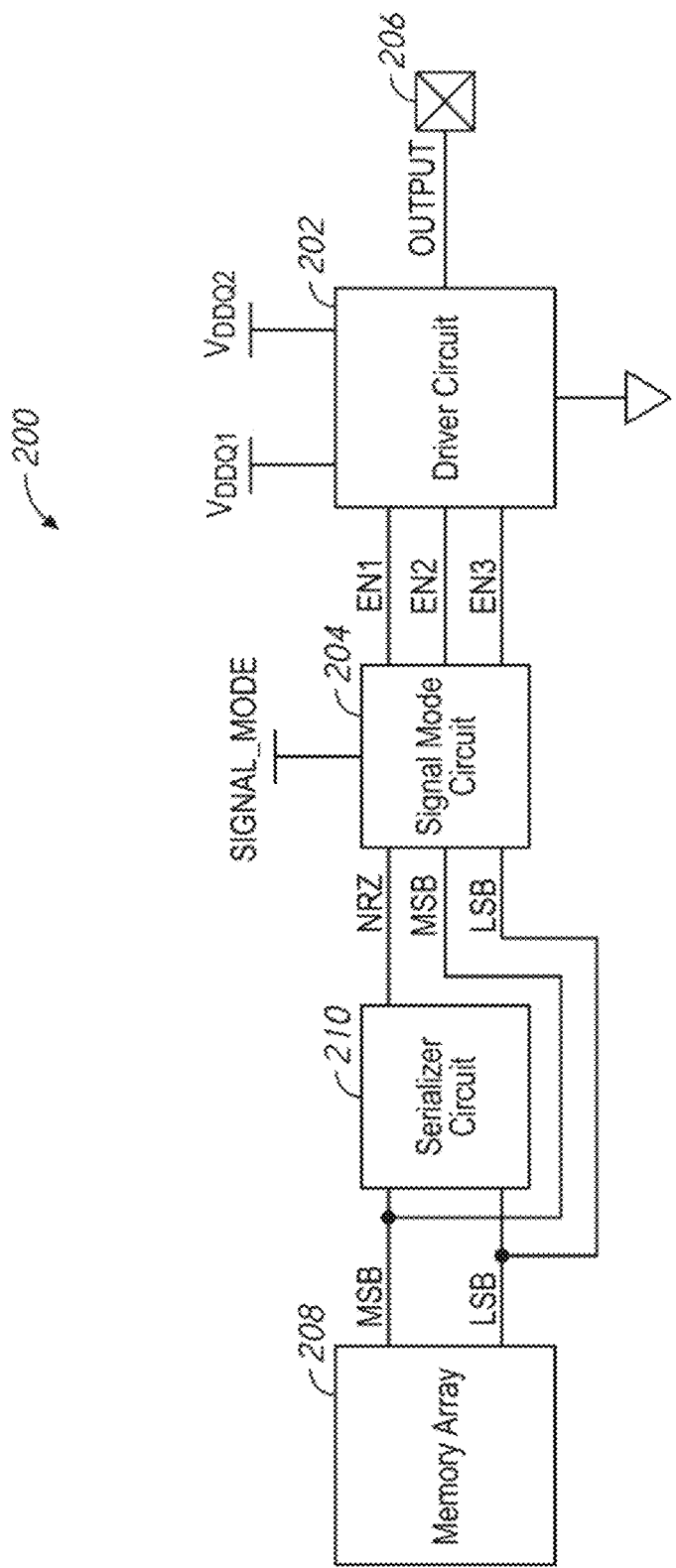
FIG. 2 is a block diagram of a memory device including a driver circuit, in accordance with an embodiment of the present invention.

FIG. 2 is a block diagram of a memory device, generally designated 200, including a driver circuit 202, in accordance with an embodiment of the present invention. The memory device 200 further includes a signal mode circuit 204, an output node 206, a memory array 208, and a serializer circuit 210. The driver circuit 202, the signal mode circuit 204, and the output node 206 may be substantially the same as the driver circuit 102, the signal mode circuit 104, and the output node 106, discussed above with respect to FIG. 1.

The memory array 208 includes an array of memory cells configured to store and provide data. The memory array 208 may generally be volatile or non-volatile memory including, but not limited to dynamic random access memory (DRAM). synchronous random access memory (SRAM), thyristor random access memory (T-RAM), zero-capacitor random access memory (Z-RAM), NAND flash, NOR flash, phase change memory (PCM), or any other type of memory.

In response to a read operation, the memory array 208 may be configured to provide two or more signals in parallel carrying data bits read from the memory array 208. As shown in FIG. 2, the two signals may be the most significant bit (MSB) and the least significant bit (LSB). In various embodiments, the MSB signal and the LSB signal may each be binary signals for providing a single data bit per data window. The signals may be further encoded, for example by Gray encoding or data bus inversion, to reduce full swing transitions, minimize power consumption, etc.

The serializer circuit 210 receives the parallel MSB and LSB signals from the memory array 208 and arranges the data in serial order. The serializer circuit 210 may be, for example, a multiplexer circuit. The serialized data is then provided by the signal mode circuit 204 as NRZ data (e.g., substantially the same as the LO_SPD_DATA signal in FIG. 1). The MSB and LSB signals may also be provided to the signal mode circuit 204. Combined, the MSB and LSB signals may combine to constitute a PAM signal (e.g., substantially the same as the HI_SPD_DATA signal in FIG. 1).

In the embodiment of FIG. 2, the SIGNAL_MODE signal may be provided to the signal mode circuit 204. The SIGNAL_MODE signal may be provided, for example, by control logic (not shown) associated with the memory array 208. The SIGNAL_MODE signal may have a value indicative of the operating speed/required bandwidth of the memory array 208. The signal mode circuit 204 may selectively set or alter the values of the enable signals EN1-3 based on the SIGNAL_MODE signal to control which supply voltage is coupled to the output node 206 to drive the OUTPUT signal.

Figure 3:
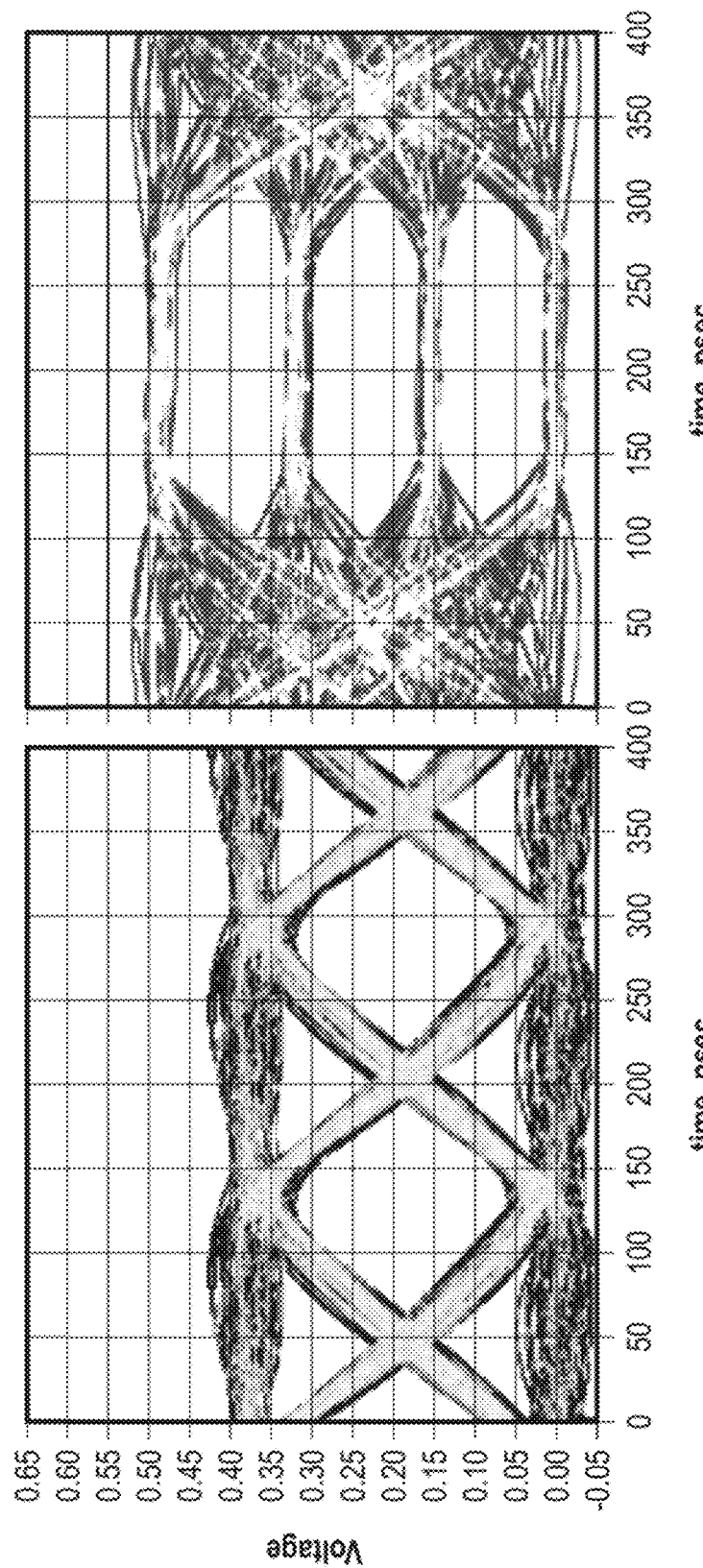
FIG. 3A is a graph depicting an output signal with a binary signal, in accordance with an embodiment of the present invention.
FIG. 3B is a graph depicting an output signal with a multilevel signal, in accordance with an embodiment of the present invention.

FIG. 3A is a graph depicting an OUTPUT signal with a binary signal, in accordance with an embodiment of the present invention. With reference to FIG. 2, when the memory array 208 is operating with relatively low speeds/bandwidth requirements, the signal mode circuit 204 provides the enable signals EN1-3 based on the NRZ signal, and the driver circuit 202 drives the OUTPUT signal as a binary signal with the first supply voltage $V_{DDQ1}$. FIG. 3A shows the levels of the binary OUTPUT signal as having a low level at approximately 0V and a high level at between about 0.35V and about 0.40V.

FIG. 3B is a graph depicting an OUTPUT signal with a multilevel signal, in accordance with an embodiment of the present invention. With reference to FIG. 2, when the memory array 208 is operating with relatively high speeds/bandwidth requirements, the signal mode circuit 204 provides the enable signals EN1-3 based on the PAM signals (e.g., MSB and LSB), and the driver circuit 202 drives the OUTPUT signal as a multilevel signal with the second supply voltage $V_{DDQ2}$. FIG. 3B shows the levels of the multilevel OUTPUT signal as having four distinct signal levels at approximately 0V, 0.15V, 0.30V. and 0.5V. Each of these levels may correspond to a pair of bits. For example, 0V may correspond to '00', 0.15V may correspond to '01', 0.30V may correspond to '10', and 0.50V may correspond to '11'. It should be noted that FIGS. 3A and 3B illustrate a sample of an OUTPUT signal over the same time frames. Thus, by switching to the higher second supply voltage $V_{DDQ2}$ and driving the OUTPUT signal with a multilevel signal, the bandwidth of the OUTPUT signal may be increased.

Figure 4:
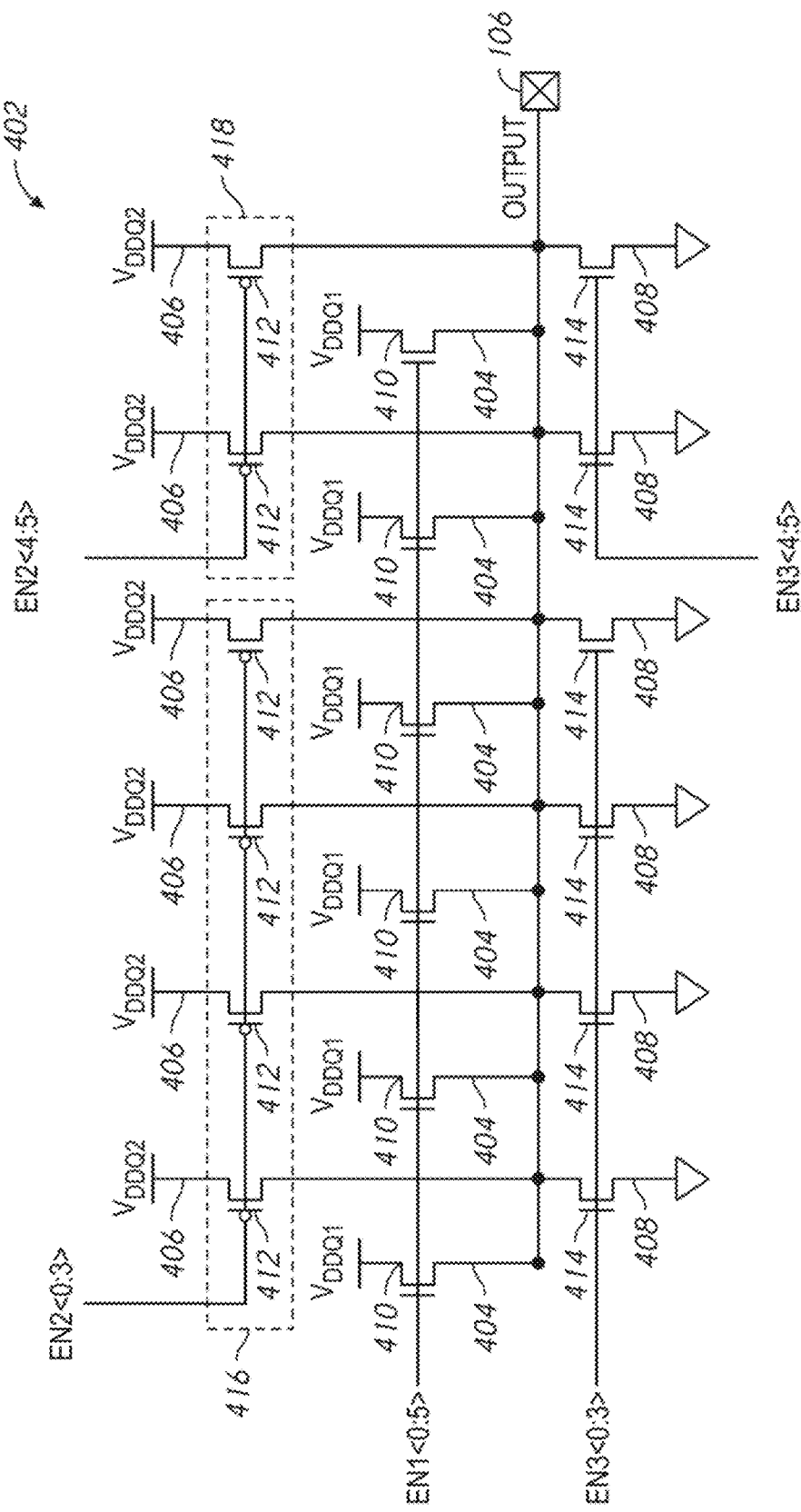
FIG. 4 is a schematic diagram of a driver circuit, in accordance with an embodiment of the present invention.

FIG. 4 is a schematic diagram of a driver circuit, generally designated 402, in accordance with an embodiment of the present invention. The driver circuit 402 may be implemented as the driver circuit 102 and 202 of FIGS. 1 and 2.

The driver circuit 402 includes a first set of pull-up driver legs 404 coupled in parallel to the output node 106, a second set of pull-up driver legs 406 coupled in parallel to the output node 106, and a set of pull-down driver legs 408 coupled in parallel to the output node 106.

Each pull-up driver leg 404 of the first set of pull-up driver legs 404 includes a pull-up NFET (N-channel field effect transistor) 410 coupled between the first supply voltage $V_{DDQ1}$ and the output node 106. The NFETs 410 may all be the same size (e.g., have the same gate width) or be different sizes (e.g., have different gate widths). The gates of the pull-up NFETs 410 are coupled to the enable signal EN1<0:5>. The enable signal EN1<0:5> may be a bussed signal that includes one enable signal for each of the pull-up driver legs 404. For example, the gate of a first pull-up NFET 410 is coupled to the enable signal EN1<0>, the gate of a second pull-up NFET 410 is coupled to the enable signal EN1<1>, etc. Thus, each pull-up driver leg 404 is independently controllable by the constituent enable signals of the enable signal EN1<0:5>. By selectively activating or deactivating one or more of the pull-up NFETs 410, the first supply voltage $V_{DDQ1}$ may be coupled to the output node 106 to drive the OUTPUT signal. By increasing the number of activated pull-up NFETs 410, the drive strength of the OUTPUT signal may be increased. Alternatively, by decreasing the number of activated pull-up NFETs 410, the drive strength of the OUTPUT signal may be decreased. When one or more of the pull-up driver legs 404 are activated, all of the pull-up drive legs 406 may be deactivated to ensure that the OUTPUT signal is driven by a single supply voltage (e.g., the first supply voltage $V_{DDQ1}$).

The driver circuit 402 may selectively couple the first supply voltage $V_{DDQ1}$ to the output node 106 through one or more pull-up driver legs 404 to drive the OUTPUT signal. One or more of the constituent signals of the enable signal EN1<0:5> may be enabled when the apparatus has a relatively low operating speed/bandwidth requirement. For example, with reference to FIG. 2, when the SIGNAL_MODE signal indicates that the memory array 208 is operating at a relatively low speed or does not require increased bandwidth, the signal mode circuit 204 may selectively activate one or more constituent signals of the enable signal EN1 based on the NRZ signal received from the serializer circuit 210. Because the first supply voltage $V_{DDQ1}$ is used during relatively low operating speeds and low bandwidth requirements, a relatively low voltage may be used (e.g., ≤0.6V)

Each pull-up driver leg 406 of the second set of pull-up drivers 406 includes a pull-up PFET (P-channel field effect transistor) 412 coupled between the second supply voltage $V_{DDQ2}$ and the output node 106. The gates of the pull-up PFETs 412 are coupled to an enable signal EN2<0:5>. The enable signal EN2<0:5> may be a bussed signal that provides one enable signal for each of the pull-up driver legs 406. For example, the gate of a first pull-up PFET 412 is coupled to the enable signal EN2<0>, the gate of a second pull-up PFET 412 is coupled to the enable signal EN2<1>, etc. Thus, each pull-up driver leg 406 is independently controllable by the constituent enable signals of the enable signal EN2<0:5>. By selectively activating or deactivating one or more of the pull-up PFETs 412, the second supply voltage $V_{DDQ2}$ may be coupled to the output node 106 to drive the OUTPUT signal. By increasing the number of activated pull-up PFETs 412, the drive strength of the OUTPUT signal may be increased. Alternatively, by decreasing the number of activated pull-up PFETs 412, the drive strength of the OUTPUT signal may be decreased. When one or more of the pull-up driver legs 406 are activated, all of the pull-up drive legs 404 may be deactivated to ensure that the OUTPUT signal is driven by a single supply voltage (e.g., the second supply voltage $V_{DDQ2}$).

The driver circuit 402 may selectively couple the second supply voltage $V_{DDQ2}$ to the output node 106 through one or more pull-up driver legs 406 to drive the OUTPUT signal. One or more of the constituent signals of the enable signal EN2<0:5> may be enabled when the apparatus has a relatively high operating speed/bandwidth requirement. For example, with reference to FIG. 2, when the SIGNAL_MODE signal indicates that the memory array 208 is operating at a relatively high speed or requires increased bandwidth, the signal mode circuit 204 may selectively activate one or more constituent signals of the enable signal EN2 based on the PAM signal (e.g., the MSB and LSB signals) received from the memory array 208.

As shown in FIG. 4, the enable signal EN2<0:5> may be provided as two enable signals: EN2<0:3> and EN2<4:5>. The enable signal EN2<0:3> may be provided by the signal mode circuit 204 based on the MSB signal received from the memory array 208 to a first subset 416 of PFETs 412. The enable signal EN2<4:5> may be provided by the signal mode circuit 204 based on the LSB signal received from the memory array 208 to a second subset 418 of the PFETs 418. By independently activating the pull-up driver legs 406 using the MSB and LSB signals, the drive strength may be controlled to provide a multilevel OUTPUT signal. Driving the OUTPUT signal as an MLS increases the bandwidth of the data provided without requiring an increase in the clock speed of the apparatus. An MLS may require a higher voltage (e.g., ≥0.9V) than a traditional binary signal. By activating the pull-up PFETs 412 only when necessary to accommodate higher operating speeds/bandwidth requirements, the driver circuit 402 may increase power efficiency. That is, the driver circuit 402 may default to driving the OUTPUT signal with the lower first supply voltage $V_{DDQ1}$ during operation at slower speeds, and only drive the OUTPUT signal with the higher second supply voltage $V_{DDQ2}$ during higher demand operation, increasing the power efficiency.

Each of the pull-down driver legs 408 includes an n-channel field effect transistor (NFET) 414 coupled between ground and the output node 106. The gates of the pull-down NFETs 414 may be coupled to an enable signal EN3<0:5>. Depending on whether the driver circuit 402 is driving the OUTPUT signal with the first supply voltage $V_{DDQ1}$ or the second supply voltage $V_{DDQ2}$, one of the pull-down driver legs 408 may be activated for each deactivated pull-up driver leg 404, 406 in the selected mode. For example, when the driver circuit 402 is driving the OUTPUT signal using the first supply voltage $V_{DDQ1}$ (e.g., one or more of the pull-up NFETs 410 are active), then for each inactive pull-up NFET 410, one of the pull-down NFETs 414 is activated. As a specific example, if the enable signals EN1<0:4> are active and the enable signal EN1<5> is inactive, then one of the pull-down NFETs 414 may be activated (e.g., by enable signal EN3<5>) and the remainder of the pull-down NFETs 414 may be deactivated (e.g., by enable signal EN3<0:4>). Because both the pull-up driver legs 404 and the pull-down driver legs 408 are implemented with NFETs, this may be accomplished by providing the enable signal EN3<0:5> as the complement of the enable signal EN1<0:5>. In another embodiment, the drive strength of the OUTPUT signal may be adjusted by simultaneously deactivating one or more pull-up driver legs 404 and 406 and pull-down driver legs 408. For example, a subset of the pull-up driver legs 404 and 406 and the pull-down driver legs 408 may be held inactive, thereby setting a maximum number of available driver legs that may be used to drive the OUTPUT signal. Additionally, there may be different numbers of pull-up driver legs 404 and 406 and pull-down driver legs 408.

As another example, when the driver circuit 402 is driving the OUTPUT signal with the second supply voltage $V_{DDQ2}$, (e.g., one or more of the pull-up PFETs 412 are active), then for each inactive pull-up PFET 412, one of the pull-down NFETs 414 is activated. As a specific example, if the enable signals EN2<0:4> are active and the enable signal EN2<5> is inactive, then one of the pull-down NFETs 414 is activated (e.g., by enable signal EN3<5>) and the remainder of the pull-down NFETs 414 are deactivated (e.g., by enable signal EN3<0:4>). Because the pull-up driver legs 406 are implemented with PFETs and the pull-down driver legs 408 are implemented with NFETs, this may be accomplished by setting the values of the enable signal EN3<0:5> to be the same as the enable signal EN2<0:5>.

Implementing the pull-up driver legs 406 with PFETs and the pull-down driver legs 408 with NFETs may allow for a greater voltage swing between the ground and the peak voltage when using the second set of pull-up driver legs 406 to drive the OUTPUT signal. Many traditional driver circuits, which use only NFETs for both the pull-up and pull-down driver legs, are limited in the voltage that can be used to drive the OUTPUT signal by the gate to source voltage of the NFETs, thus limiting the achievable voltage swing. Increasing the voltage swing is desirable when driving MLS OUTPUT signals because a larger voltage swing allows for more distinctly defined signal levels.

As a specific example, the driver circuit 402 may drive an MLS OUTPUT signal by selectively activating the first subset 416 and/or the second subset 418 of pull-up PFETs 412. For example, to provide a 2-bit OUTPUT signal having a value 00, the driver circuit 402 may deactivate all of the pull-up PFETs 412 of the first subset 416 and the second subset 418 by providing a logical high signal on all six enable signals EN2<0:5> and activate all of the pull-down NFETs 414 by providing a logical high signal on all six enable signals EN3<0:5>. To provide an OUTPUT signal having a value 01, the driver circuit may selectively activate the second subset 418 of pull-up PFETs 412 by providing a logical low signal on the second enable signals EN2<4:5>. The driver circuit deactivates corresponding pull-down NFETs 314 by providing a logical low enable signal EN3<4:5>. To provide the OUTPUT signal having a value 01, the first subset 416 of pull-up PFETs 412 remain deactivated by the second enable signal EN2<0:3>. To provide an OUTPUT signal having a value 10, the driver circuit 402 may enable the first subset 416 of pull-up PFETs 412 with a logical low second enable signal EN2<0:3> while deactivating the second subset 418 of pull-up PFETs 412 with a logical high second enable signal EN2<4:5>. A subset of pull-down NFETs 414 corresponding to the first subset 416 of pull-up PFETs 412 is deactivated with a logic low third enable signal EN3<0:3>. A subset of pull-down NETs 414 may be activated by a logic high third enable signal EN3<4:5>. To provide an OUTPUT signal having a value 11, both the first and second subsets 416 and 418 of pull-up PFETs 412 may be activated by logic low second enable signals EN2<0:5> and all of the pull-down NFETs 414 may be deactivated by logic low third enable signals EN2<0:5>.

Figure 5:
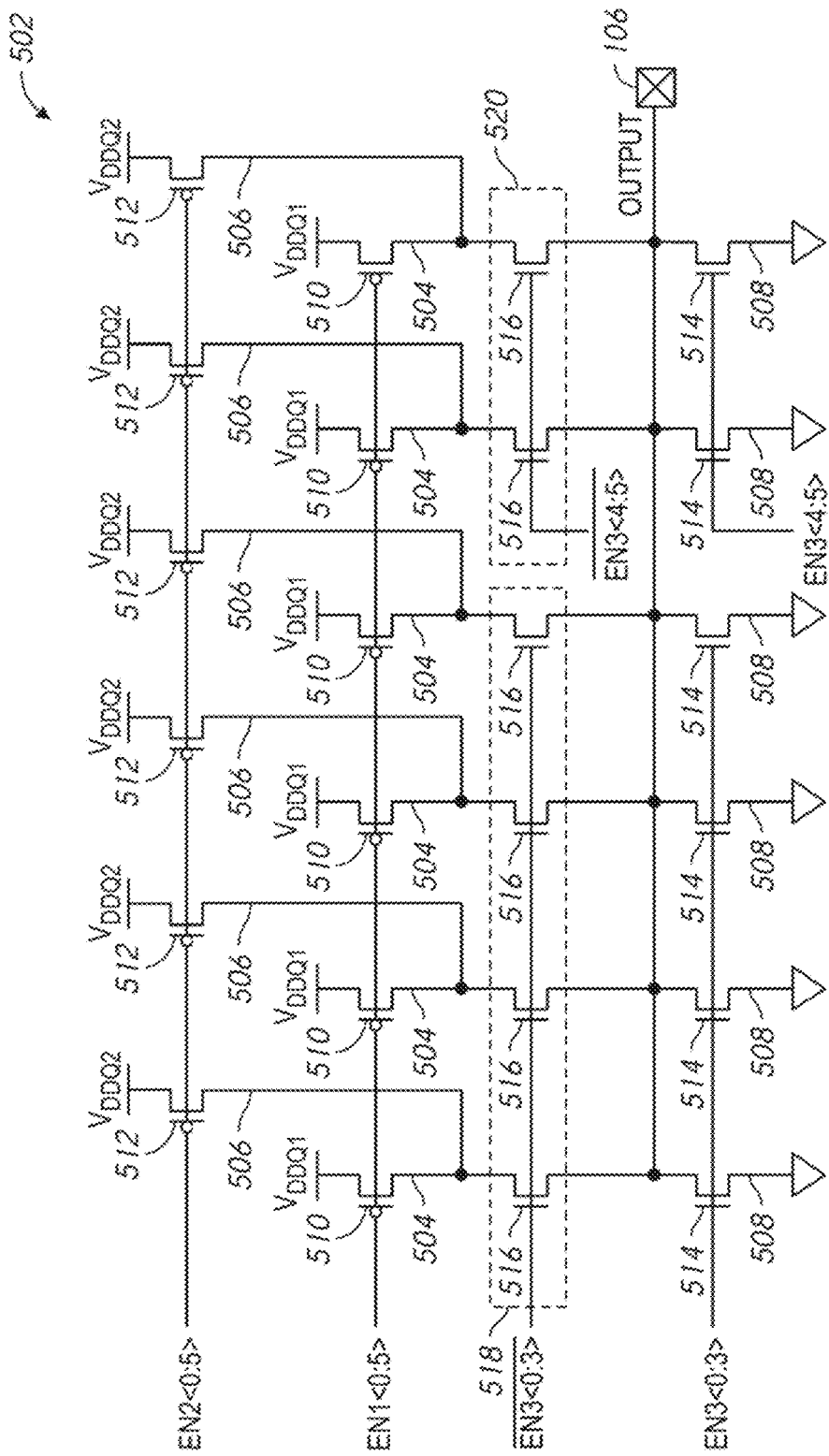
FIG. 5 is a schematic diagram of a driver circuit, in accordance with an embodiment of the present invention.

FIG. 5 is a schematic of a driver circuit, generally designated 502, in accordance with an embodiment of the present invention. The driver circuit 502 may be implemented as the driver circuit 102 and 202 of FIGS. 1 and 2. The driver circuit 502 includes a first set of pull-up driver legs 504, a second set of pull-up driver legs 506, and a set of pull-down driver legs 508. The driver circuit 502 further includes a set of pull-up leg transistors 516.

The pull-down driver legs 508 include pull-down NFETs 514 that selectively couple the ground to the output node. The gates of the pull-down NFETs are coupled to the enable signal EN3<0:5>. The pull-down driver legs 508 operate in substantially the same manner as the pull-down driver legs 408 described above with respect to FIG. 4.

Each pull-up driver leg 504 is coupled to a pull-up leg transistor 516 in parallel with one of the pull-up driver legs 506. The pull-up leg transistors 516 are coupled to the output node 106. Each pull-up driver leg 504 includes a PFET 510 for selectively coupling the first supply voltage $V_{DDQ1}$ to the pull-up transistor 516. Each pull-up driver leg 506 includes a PFET 512 for selectively coupling the second supply voltage $V_{DDQ2}$ to the pull-up transistor 516. The gates of the PFETs 510 and 512 are coupled to the enable signal EN1<0:5> and EN2<0:5>, respectively. The enable signals EN1<0:5> and EN2<0:5> may be received from the signal mode circuits 104 or 204, as described above. The gates of the pull-up transistors 516 may be configured to receive the complement of the enable signals EN3<0:3>. Thus, for each pull-down driver leg 508 that is activated by the pull-down NFETs 514, there is a corresponding pair of pull-up driver legs 504, 506 that is deactivated by the pull-up transistors 516. Similarly, for each pull-up transistor 516 that is activated, there is a corresponding pull-down driver leg 508 that is deactivated.

With reference to FIGS. 2 and 5, when the memory device 200 is operating at relatively low speeds/bandwidth requirements, the memory device 200 may provide the SIGNAL_MODE signal to the signal mode circuit 204, which provides the enable signal EN1<0:5> based on the NRZ signal to activate one or more of the pull-up PFETs 510 to provide the first supply voltage $V_{DDQ1}$ to the pull-up transistors 516. While the one or more pull-up PFETs 510 are active, the signal mode circuit 204 also provides the enable signal EN2<0:5> to deactivate the pull-up PFETs 512 to decouple the second supply voltage $V_{DDQ2}$ from the pull-up transistors 516. To adjust the drive strength, the signal mode circuit 204 may adjust the enable signal EN3<0:5> to selectively activate one or more pull-down NFETs 514, and the complement of the enable signal EN3<0:5> may selectively deactivate one or more corresponding pull-up transistors 516.

When the memory device 200 is operating at relatively high speeds/bandwidth requirements, the memory array 208 may provide the SIGNAL_MODE signal to the signal mode circuit 204, which provides the enable signal EN2<0:5> based on the PAM signals to activate one or more of the pull-up PFETs 512 to provide the second supply voltage $V_{DDQ2}$ to the pull-up transistors 516. While the one or more pull-up PFETs 512 are active, the signal mode circuit 204 also provides the enable signal EN1<0:5> to deactivate the pull-up PFETs 510 to decouple the first supply voltage $V_{DDQ1}$ from the pull-up transistors 516. To adjust the drive strength, the signal mode circuit 204 may adjust the enable signal EN3<0:5> to selectively activate one or more pull-down NFETs 514, and the complement of the enable signal EN3<0:5> may selectively deactivate one or more corresponding pull-up transistors 516. Additionally, the values of the enable signals EN3<0:5> may be adjusted to drive an MLS OUTPUT signal at the output node 106 by selectively activating a first subset 518 and/or a second subset 520 of pull-up transistors. For example, driving the enable signals EN3<0:3> differently than the enable signals EN3<4:5> drives the OUTPUT signal at an intermediate level between ground and the second supply voltage $V_{DDQ2}$. Those skilled in the art will appreciate that by adjusting the enable signals EN3<0:5>, different numbers of pull-up transistors 516 and pull-down NFETs 514 may be activated/deactivated to drive the OUTPUT signal at different levels.

Figure 6:
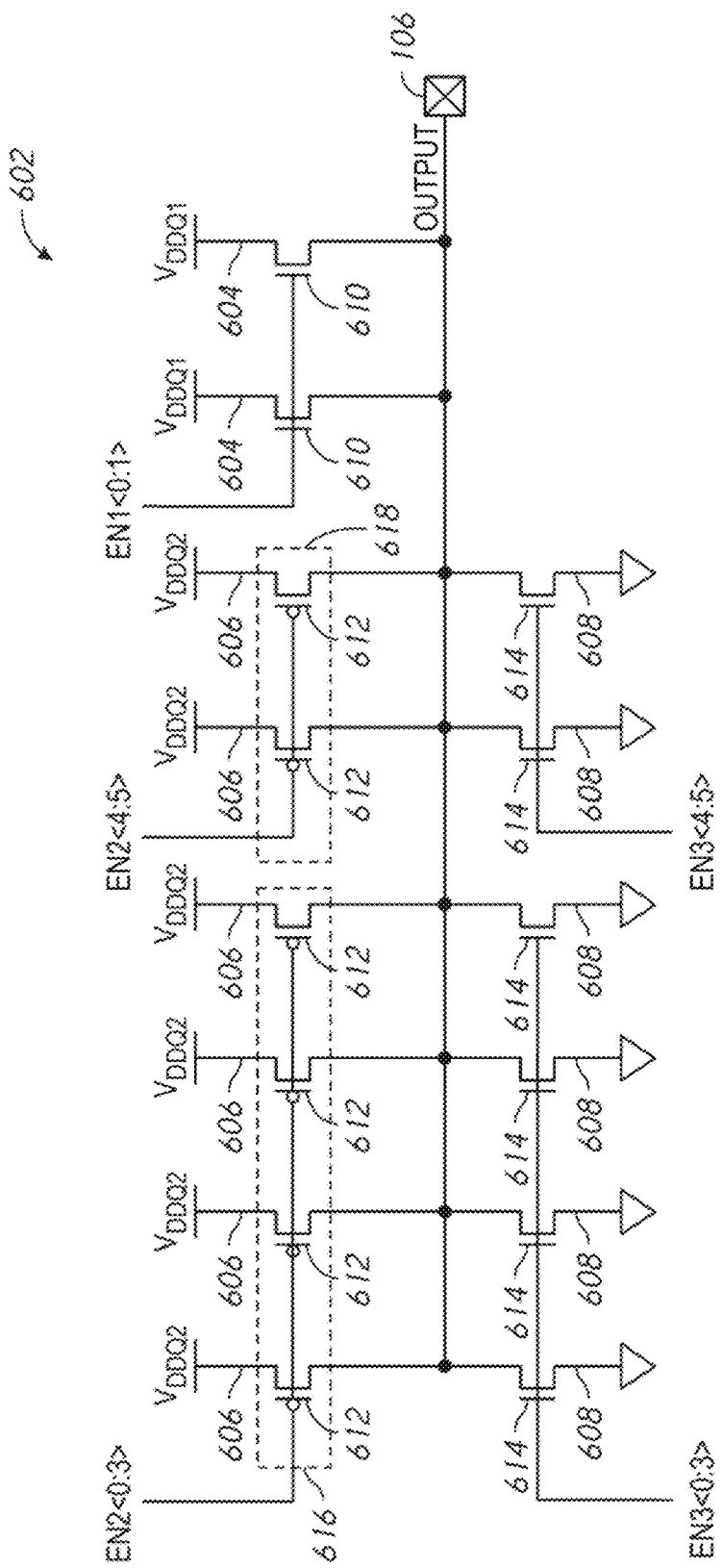
FIG. 6 is a schematic diagram of a driver circuit, in accordance with an embodiment of the present invention.

FIG. 6 is a schematic of a driver circuit, generally designated 602, in accordance with an embodiment of the present invention. The driver circuit 602 includes a first set of pull-up driver legs 604, a second set of pull-up driver legs 606, and a set of pull-down driver legs 608 all coupled to the output node 106. The first set of pull-up driver legs 604 includes pull-up NFETs 610 coupled between the first supply voltage $V_{DDQ1}$ and the output node 106. The second set of pull-up driver legs 606 includes pull-up PFETs 612 coupled between the second supply voltage $V_{DDQ2}$ and the output node 106. The set of pull-down driver legs 608 includes pull-down NFETs 614 coupled between ground and the output node 106. An MLS OUTPUT signal may be driven by selectively activating a first subset 616 and/or a second subset 618 of pull-up PFETs 612 as described above with respect to FIG. 4. The driver circuit 602 differs from the driver circuit 402 in that it includes fewer pull-up driver legs 604 than pull-up driver legs 606. The embodiment of FIG. 6 recognizes that, because the first supply voltage $V_{DDQ1}$ is used to drive the OUTPUT signal at relatively low speeds, fewer pull-up driver legs 604 may be necessary than when the driver circuit 602 drives the OUTPUT signal with the second supply voltage $V_{DDQ2}$. By using fewer pull-up driver legs 604, power efficiency may be further improved. Because there are fewer pull-up driver legs 604, the enable signal EN1<0:1> may also have fewer constituent signals than the enable signal EN1<0:5> of FIG. 4.

Figure 7:
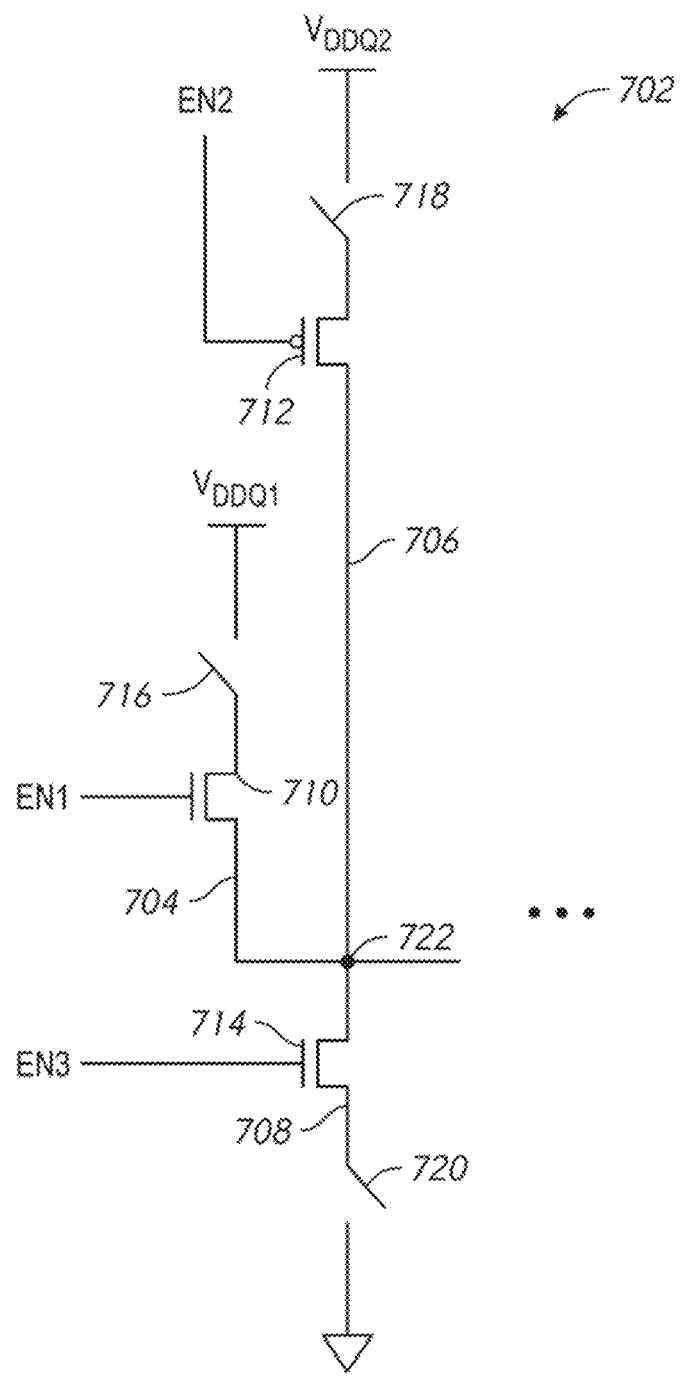
FIG. 7 is a schematic diagram of a driver circuit with series switches, in accordance with an embodiment of the present invention.

FIG. 7 is a schematic diagram of a portion of a driver circuit, generally designated 702, with series switches, in accordance with an embodiment of the present invention. The driver circuit 702 includes a first pull-up driver leg 704, a second pull-up driver leg 706, and a pull-down driver leg 708. The first pull-up driver leg 704 includes a pull-up NFET 710 coupled between the first supply voltage $V_{DDQ1}$ and a node 722, which may be coupled to an output node, such as output node 106. The second pull-up driver leg 706 includes a pull-up PFET 712 coupled between the second supply voltage $V_{DDQ2}$ and the node 722. The pull-down driver leg 708 includes a pull-down NFET 714 coupled between ground and the node 722. The driver circuit 702 may be substantially the same as the driver circuit 402, except that each driver leg includes a switch. For example, the first pull-up driver leg 704 includes a switch 716 coupled between the pull-up NFET 710 and the first supply voltage $V_{DDQ1}$, the second pull-up driver leg 706 includes a switch 718 coupled between the pull-up PFET 712 and the second supply voltage $V_{DDQ2}$, and the pull-down driver leg 708 includes a switch 720 coupled between the pull-down NFET 714 and ground. Those skilled in the art will appreciate that one or more of the switches 716, 718, and 720 may be omitted in various embodiments. Use of the switches 716, 718, and 720 in series with the driver legs may enable the enable signals EN1-3 to remain static during operation while the switches are enabled dynamically, saving time and power by avoiding rerouting the NRZ and PAM signals to generate the enable signals EN1-3 by the signal mode circuit (e.g., signal mode circuit 104, 204). However, including the switches 716, 718, and 628 add additional components to the driver circuit 702 that take up valuable space, which may be undesirable as devices become smaller.

Figure 8:
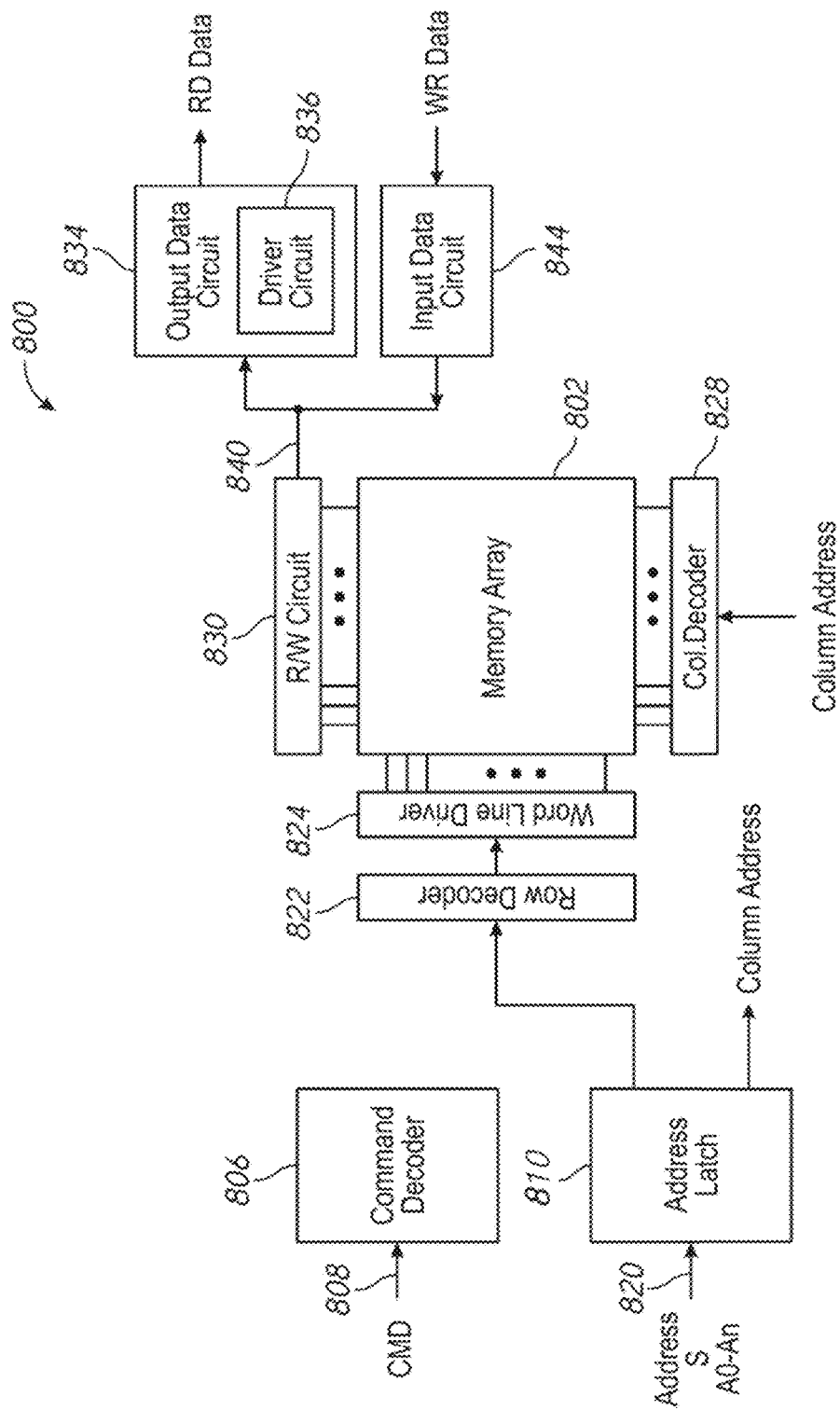
FIG. 8 is a block diagram of a memory, in accordance with an embodiment of the present invention.

FIG. 8 is a block diagram of a memory, according to an embodiment of the invention. The memory 800 may include an array 802 of memory cells, which may be, for example, volatile memory cells (e.g., dynamic random-access memory (DRAM) memory cells, static random-access memory (SRAM) memory cells), non-volatile memory cells (e.g., flash memory cells), or some other types of memory cells. The memory 800 includes a command decoder 806 that may receive memory commands through a command bus 808 and provide (e.g., generate) corresponding control signals within the memory 800 to carry out various memory operations. For example, the command decoder 806 may respond to memory commands provided to the command bus 808 to perform various operations on the memory array 802. In particular, the command decoder 806 may be used to provide internal control signals to read data from and write data to the memory array 802. Row and column address signals may be provided (e.g., applied) to an address latch 810 in the memory 800 through an address bus 820. The address latch 810 may then provide (e.g., output) a separate column address and a separate row address.

The address latch 810 may provide row and column addresses to a row address decoder 822 and a column address decoder 828, respectively. The column address decoder 828 may select bit lines extending through the array 802 corresponding to respective column addresses. The row address decoder 822 may be connected to a word line driver 824 that activates respective rows of memory cells in the array 802 corresponding to received row addresses. The selected data line (e.g., a bit line or bit lines) corresponding to a received column address may be coupled to a read/write circuitry 830 to provide read data to an output data buffer 834 via an input-output data path 840. The output data buffer 834 may include a driver circuit 836. The driver circuit 836 may be implemented as any of the driver circuits 102, 202, 402, 502, and 602 discussed above with respect to FIGS. 1-5. Write data may be provided to the memory array 802 through an input data buffer 844 and the memory array read/write circuitry 830.

Those of ordinary skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Skilled artisans may implement the described functionality in varying ways for each particular application, but such implementation decisions should not be interpreted as causing a departure from the scope of the present disclosure.

What is claimed is:

1. An apparatus comprising:
a driver circuit configured to selectively provide a first supply voltage to an output node in a first operating mode, to selectively provide a second supply voltage to the output node in a second operating mode, and to selectively provide a third supply voltage that is less than the first and second supply voltages to the output mode in the first and second operating modes, based on one or more enable signals, wherein the driver circuit comprises:
a first set of pull-up driver legs configured to selectively provide the first supply voltage to the output node based on a first enable signal;

a second set of pull-up driver legs configured to selectively provide the second supply voltage to the output node based on a second enable signal; and a set of pull-down driver legs configured to selectively provide the third supply voltage to the output node based on a third enable signal.

2. The apparatus of claim 1, wherein each pull-up driver leg of the first set of pull-up driver legs comprises an NFET coupled between a first voltage source and the output node, the first voltage source configured to provide the first supply voltage.

3. The apparatus of claim 1, wherein each pull-up driver leg of the second set of pull-up driver legs comprises a PFET coupled between a second voltage source and the output node, the second voltage source configured to provide the second supply voltage.

4. The apparatus of claim 1, wherein each pull-down driver leg of the set of pull-down driver legs comprises an NFET coupled between ground and the output node, wherein the third supply voltage is ground.

5. The apparatus of claim 1, wherein the first set of pull-up driver legs is coupled to the output node in parallel, the second set of pull-up driver legs is coupled to the output node in parallel, and the set of pull-down driver legs is coupled to the output node in parallel.

6. The apparatus of claim 1, wherein each pull-up driver leg of the first and second sets of pull-up driver legs and each pull-down driver leg comprises a switch for selectively activating a corresponding pull-up driver leg or pull-down driver leg.

7. The apparatus of claim 1, further comprising:
a plurality of pull-up transistors, each pull-up transistor of the plurality of pull-up transistors coupled to a pull-up driver leg of the first set of pull-up driver legs, a pull-up driver leg of the second set of pull-up driver legs, and the output node, wherein the plurality of pull-up transistors is configured to selectively provide one of the first supply voltage and the second supply voltage to the output node based on the third enable signal.

8. The apparatus of claim 1, wherein the driver circuit is further configured to provide a binary signal when operating in the first operating mode and to provide a multilevel signal when operating in the second operating mode.

9. An apparatus comprising:
a driver circuit configured to drive an output signal with a first supply voltage or a second supply voltage based on one or more enable signals, wherein the first supply voltage is provided to drive the output signal by a first plurality of pull-up transistors and the second supply voltage is provided to drive the output signal by a second plurality of pull-up transistors; and
a signal mode circuit configured to provide the one or more enable signals based on an operating speed of a memory.

10. The apparatus of claim 9, wherein the signal mode circuit is configured to receive a signal mode command indicative of the operating speed of the memory.

11. The apparatus of claim 10, further comprising:
a serializer circuit coupled to the memory array and the signal mode circuit, the serializer circuit configured to receive the parallel data and provide serialized data to the signal mode circuit.

12. The apparatus of claim 11, wherein the signal mode circuit is further configured to provide the enable signals based on the parallel data and the serialized data.

13. The apparatus of claim 12, wherein the signal mode circuit is further configured to provide enable signals having a first value based on the serialized data responsive to the signal mode command indicating that the memory array has a first operating speed and to provide enable signals having a second value based on the parallel data responsive to the signal mode command indicating that the memory array has a second operating speed.

14. The apparatus of claim 13, wherein the driver circuit is configured to drive the output signal with the first supply voltage responsive to the enable signals having the first value and to drive the output signal with the second supply voltage responsive to the enable signals having the second value.

15. A method comprising:
receiving, at a driver circuit, one or more enable signals having a first value;
responsive to receiving the one or more enable signals having the first value, driving an output signal with a first set of pull-up driver legs coupled to a first supply voltage;
receiving, at the driver circuit, one or more enable signals having a second value;
responsive to receiving the one or more enable signals having the second value, driving the output signal with a second set of pull-up driver legs coupled to a second supply voltage, wherein the second supply voltage is different than the first supply voltage.

16. The method of claim 15, wherein driving the output signal with the first and second sets of pull-up driver legs generates a multilevel signal.

17. The method of claim 16, wherein driving the output signal with the second supply voltage further comprises selectively deactivating one or more pull-up driver legs with the one or more enable signal and selectively activating one or more pull-down driver legs.

18. The method of claim 15, wherein driving the output signal with the first supply voltage comprises generating a binary signal by selectively activating one or more pull-up driver legs with the one or more enable signals.

* * * * *